(12) United States Patent
Kim et al.

(10) Patent No.: US 6,374,386 B1
(45) Date of Patent: Apr. 16, 2002

(54) DEVICE AND METHOD FOR INSERTING PREVIOUSLY KNOWN BITS IN INPUT STAGE OF CHANNEL ENCODER

(75) Inventors: Jae-Yeol Kim, Kyonggi-do; Chang Soo Park, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/378,371

(22) Filed: Aug. 20, 1999

(30) Foreign Application Priority Data

Aug. 20, 1998 (KR) ............................................. 98-34186

(51) Int. Cl.[7] ............................................. H03M 13/03
(52) U.S. Cl. ....................... 714/786; 714/788; 375/265; 375/340
(58) Field of Search .................. 714/701, 746, 714/755, 786, 788, 790, 801; 375/222, 265, 295, 340

(56) References Cited

U.S. PATENT DOCUMENTS

| | | | | | |
|---|---|---|---|---|---|
| 5,446,747 | A | * | 8/1995 | Berrou | 714/788 |
| 6,044,116 | A | * | 3/2000 | Wang | 375/265 |
| 6,088,387 | A | * | 7/2000 | Gelblum et al. | 375/222 |
| 6,212,654 | B1 | * | 3/2001 | Lou et al. | 714/701 |

* cited by examiner

Primary Examiner—Emmanuel L. Moise
(74) Attorney, Agent, or Firm—Dilworth & Barrese, LLP

(57) ABSTRACT

A turbo coding device includes a bit inserter for inserting at east one specific bit at a last position of a data bit stream being input to a first constituent encoder, and inserting at least one specific bit at a last position of an interleaved data bit stream being input to a second constituent encoder; the first constituent encoder for encoding the specific bit-inserted data bits to generate first parity symbols; an interleaver for interleaving the specific bit-inserted data bits; the second constituent encoder for encoding the interleaved data bits to generate second parity symbols; and a multiplexer for multiplexing outputs of the bit inserter, the first constituent encoder and the second constituent encoder.

6 Claims, 14 Drawing Sheets

US 6,374,386 B1

DEVICE AND METHOD FOR INSERTING PREVIOUSLY KNOWN BITS IN INPUT STAGE OF CHANNEL ENCODER

BACKGROUND OF THE INVENTION

1. Field of the Invention

The present invention relates generally to a channel encoding device and method for a communication system, and in particular, to a device and a method for inserting previously known bits in an input stage of a channel encoding device.

2. Description of the Related Art

In communication systems for processing voice, character, image and video signals, data is generally transmitted on a frame unit basis. A frame is defined as a basic timing interval in the system. Further, in a system for communicating such frame data, a channel encoder for error correction should also encode data on the frame unit basis. In this case, the channel encoder performs zero tail biting to indicate the termination of each frame so that a decoder can efficiently decode the frames using that information. Encoder tail bits represent a fixed sequence of bits added to the end of a data frame to reset the convolutional encoder to a known state. An IS-95 system typically uses a non-recursive systemic convolutional encoder, which adds a sequence of zero (0) bits to the end of each frame equal to the number of delays, to implement frame termination. However, in contrast to the non-recursive systemic convolutional encoder, a recursive systemic encoder cannot add the zero bits to the end of the frame to implement the frame termination, because input bits are fed back to the delays.

FIG. 1 illustrates a block diagram of a conventional parallel turbo encoder, which is disclosed in U.S. Pat. No. 5,446,747 issued to Berrou. The encoder of FIG. 1 is one type of conventional recursive systemic encoder. The turbo encoder encodes an N-bit input frame into parity symbols using two simple constituent encoders, and can be configured to have either a parallel or serial structure. In addition, the turbo encoder of FIG. 1 uses recursive systemic convolutional codes as constituent codes.

The turbo encoder of FIG. 1 includes an interleaver 120 interposed between a first constituent encoder 110 and a second constituent encoder 130. The interleaver 120 has the same size as a frame length, N, of input data bits and re-arranges the order of the data bits input to the second constituent encoder 130 to reduce the correlation between the outputs of the first and second encoders.

The first constituent encoder 110 encodes the input data bits and the interleaver 120 interleaves (or randomizes) the bits in the input data stream according to a specified rule so that burst errors introduced by the channel can be converted to random errors. The second constituent encoder 130 encodes the output of the interleaver 120.

FIG. 2 is a diagram illustrating a termination scheme in the recursive systemic convolutional encoder of FIG. 1. For more detailed information, see D. Divsalar and F. Pollara, On the Design of Turbo Dodes, TDA Progress Report 42–123, Nov. 15, 1995. Here, frame data input to the first and second constituent encoders 110 and 130 is assumed to be 20-bit data. In FIG. 2, D1–D4 denotes delays and XOR1–XOR6 exclusive OR gates.

Referring to FIG. 2, the operative steps to perform encoding are as follows. A switch SW1 is maintained in the ON position and a switch SW2 is maintained in the OFF position. Then, the 20-bit input frame data is applied in sequence to the delays D1–D4 and exclusively ORed by the exclusive OR gates XOR1–XOR6, thus outputting encoded bits at the output of exclusive OR gate XOR6. When the 20 data bits are all encoded in this manner, the switch SW1 is switched OFF and the switch SW2 is switched ON, for frame termination. Then, the XOR gates XOR1–XOR4 exclusively OR the output data bits of the delays and the corresponding fed-back data bits, respectively, thereby outputting zero bits. The resulting zero bits are again input to the delays D1–D4 and stored therein. These zero bits input to the delays D1–D4 become tail bits, which are applied to a multiplexer.

The multiplexer multiplexes the encoded data bits and the tail bits output from the constituent encoder. The number of generated tail bits depends on the number of delays included in the constituent encoders 110 and 130. The termination scheme of FIG. 2 generates 4 tail bits per frame plus additional encoded bits generated for each of the respective tail bits, undesirably increasing the overall final encoded bit count, which leads to a decrease in the bit rate. That is, when the bit rate is defined as;

Bit Rate=(the Number of Input Data Bits)/(the Number of Output Data Bits), a constituent encoder having the structure of FIG. 2 has a bit rate of Bit Rate=(the Number of Input Data Bits)/{(the Number of Encoded Data Bits)+(the Number of Tail Bits)+(the Number of Encoded Bits for the Tail Bits)}.

Accordingly, in FIG. 2, since the frame data is composed of 20 bits and the number of delays equals 4, the bit rate becomes 20/28.

It is therefore apparent that the recursive systemic convolutional encoders performance depends upon the tailing method, because it is difficult to perfectly tail the turbo codes.

SUMMARY OF THE INVENTION

It is, therefore, an object of the present invention to provide a device and method for inserting bits in each channel frame at positions having a higher error occur range probability having a specific value at a last position of frame data bits, wherein the last position has a high error occurrence probability during decoding in a turbo coding device.

It is another object of the present invention to provide a device and method for inserting specific bits at the tail positions of data bit streams being respectively input to a first constituent encoder and a second constituent encoder in turbo coding device.

It is a further object of the present invention to provide a device and method for inserting specific bits at the tail positions of data bit streams being respectively input to a first constituent encoder and a second constituent encoder in a turbo coding device, wherein a position of the specific bit inserted in the second constituent encoder is shifted forward when the positions of the specific bits inserted in the first and second constituent encoders overlap each other.

To achieve the above objects, a turbo coding device according to the present invention includes a bit inserter for inserting one or more specific bits at tail positions of a data bit stream being input to a first constituent encoder, and inserting at least one specific bit at a last position of an interleaved data bit stream being input to a second constituent encoder; the first constituent encoder for encoding the specific bit-inserted data bits to generate first parity symbols;

an interleaver for interleaving the specific bit-inserted data bits; the second constituent encoder for encoding the interleaved data bits to generate second parity symbols; and a multiplexer for multiplexing outputs of the bit inserter, the first constituent encoder and the second constituent encoder.

BRIEF DESCRIPTION OF THE DRAWINGS

The above and other objects, features and advantages of the present invention will become more apparent from the following detailed description when taken in conjunction with the accompanying drawings in which like reference numerals indicate like parts. In the drawings.

DETAILED DESCRIPTION OF THE PREFERRED EMBODIMENTS

Figure 1:
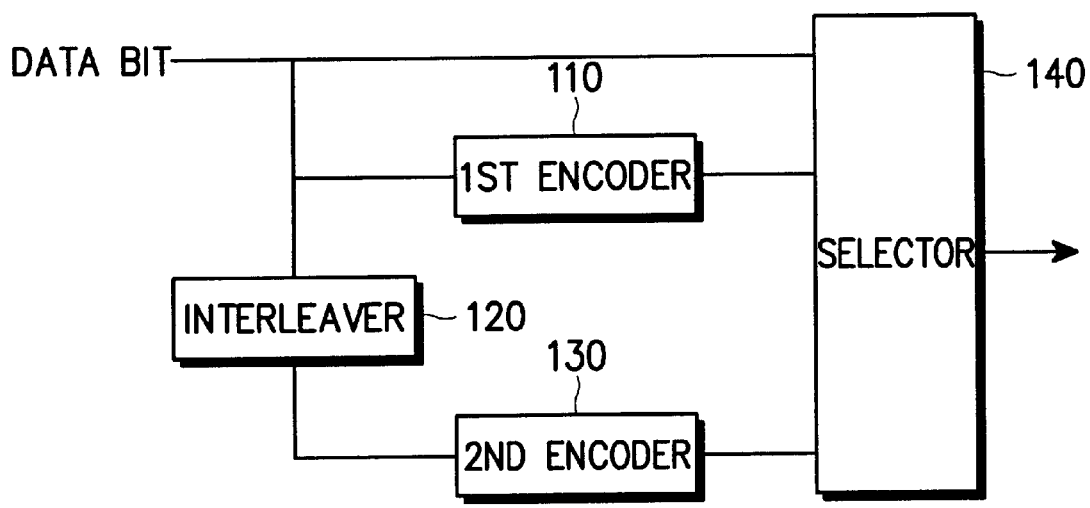
FIG. 1 is a block diagram illustrating a prior art channel encoder for use in a wireless communication system.
Figure 2:
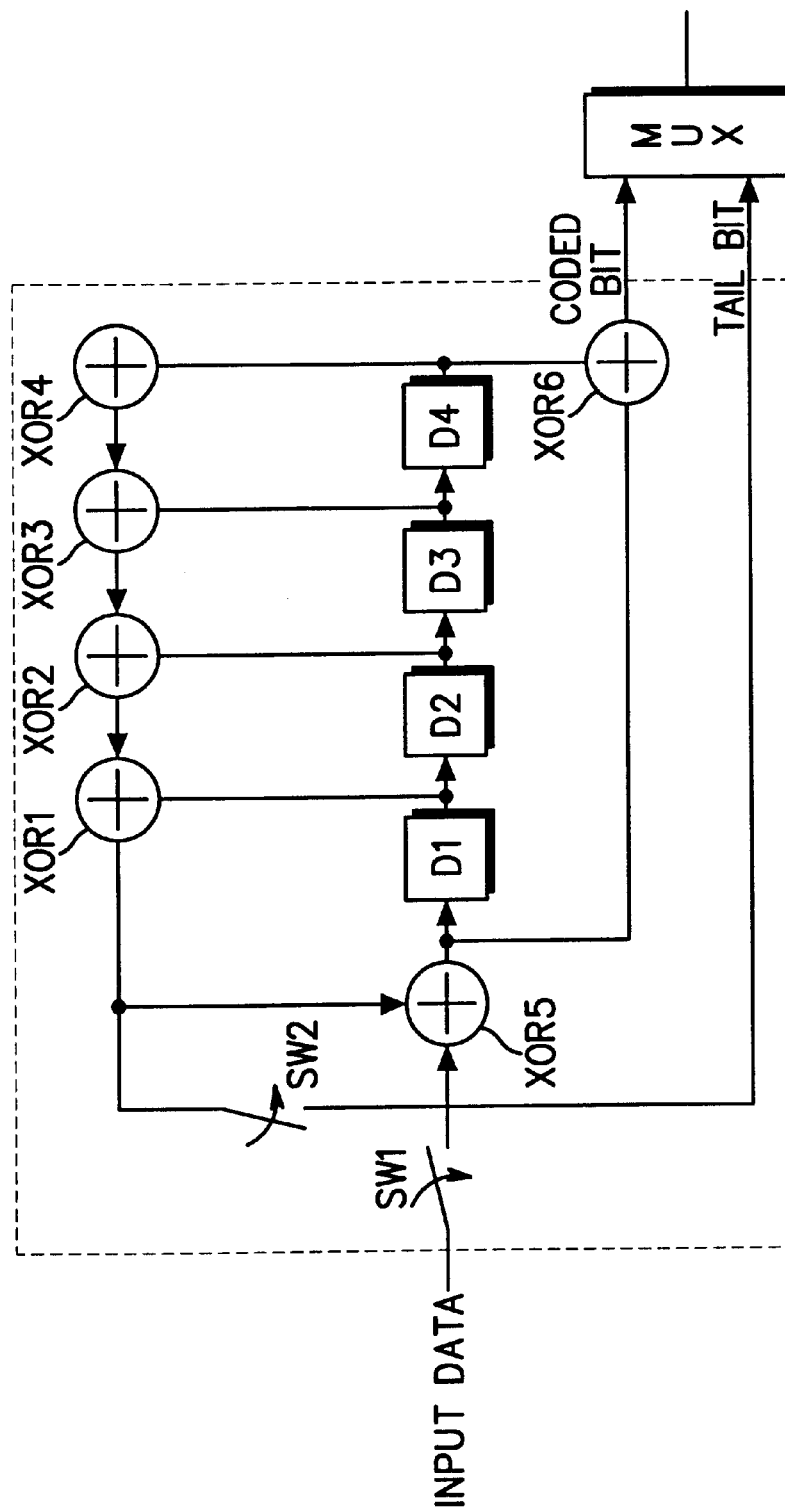
FIG. 2 is a detailed block diagram illustrating a prior art constituent encoder of FIG. 1.

Preferred embodiments of the present invention will be described herein below with reference to the accompanying drawings. In the following description, well known functions or constructions are not described in detail since they would obscure the invention in unnecessary detail. The term "data bit" as used herein refers to data which is not encoded, and the term "parity bit" refers to data which is encoded by a constituent encoder.

Generally, in a communication system, a transmitter encodes transmission data using a channel encoder and transmits the encoded data; a receiver then demodulates the data received from the transmitter to convert the received data into the original data. The channel encoder encodes the transmission data on a frame unit basis and generates tail bits, which are added to each frame to indicate a termination of the frame. The present invention discloses a frame structure having a termination effect in the channel encoder.

The frame structure having the termination effect can be implemented in accordance with several embodiments as described below:

First Embodiment: A number of specific bits are inserted in each channel frame at positions having a higher error occurrence probability, where the number of bits to be inserted is defined by the number of tail bits. Because the recursive systemic constituent encoders are not configured to generate tail bits, the error occurrence probability is determined by way of experiment, and the insert positions should be known to both the channel encoder and a channel decoder. The specific bits to be inserted should preferably be insignificant bits which have little or no impact on communication performance, whether they are transmitted or not. Also, they can be encoded bits or data bits predetermined with a receiver. Herein, they are assumed to be zero bits.

Second Embodiment: A number of bits are inserted in each channel frame at positions having a higher error occurrence probability, where the number of bits to be inserted is determined by the number of tail bits. The specific bits are inserted to exceed a predefined frame length. The bit-inserted data bits are encoded using the constituent encoders. Then, when outputting the channel encoded data, the bits exceeding the frame length of the channel encoded data are punctured at the bit-inserted positions of the input data. Here, the recursive systemic encoder does not generate tail bits and the channel decoder should have prior knowledge of the bit-inserted positions.

Third Embodiment: A number of specific bits are inserted in each channel frame at positions having a higher error occurrence probability, where the number of bits to be inserted is determined by the number of tail bits. The constituent encoder generates tail bits for termination and associated encoded data for the tail bits and thereafter, punctures the data bits at specific insert positions in each channel frame to insert the tail bits and the encoded data for the tail bits in the punctured positions selected for bit insertion.

First Embodiment

An encoder according to a first embodiment of the present invention does not generate tail bits, but rather, inserts specific bits at predetermined positions to perform the termination function. In this embodiment, one 24-bit frame includes 16 data bits, and 8 specific bits, where each of the 8 specific bits are zero bits inserted in the frame at bit positions having a higher error probability. Here, the bit insert positions are determined by experimentally detecting the positions where most errors occur while decoding the encoded data. Further, each constituent encoder uses a 1/3 coding rate.

In this embodiment, the positions having the higher error probability during decoding are experimentally determined, when the 24-bit frame data (i.e., 16 frame data bits plus the 8 specific bits) is encoded using a turbo encoder having a 1/3 coding rate. Eight bit positions having the relatively higher error probability are determined, and the specific bits are inserted at the determined positions. Here, the decoder knows the bit-inserted positions, when decoding the encoded frame data in which the specific codes are inserted.

In practice, all "0" bits are actually transmitted as "−1". When the inserted specific bits are zero bits, the zero bits at the insert positions are changed to a large negative value (e.g., −5) before decoding, in order to increase reliability. This is to improve decoding performance due to variations which can occur during transmission in a radio environment. However, since the decoder previously knows the position of the specific bit to be received, the decoder inserts a higher value other than −1 for the specific bit in the actual decoding process. In this case, the decoder can improve decoding performance by virtue of the inserted specific value. This decoding operation will be described in detail with reference to FIG. 14. In this manner, the decoder decoding the bits, knows at least 8 bits of the 24 by virtue of them being transmitted as a large negative value, thereby increasing decoding performance. In this embodiment, decoding performance increases as the frame becomes shorter.

Figure 3:
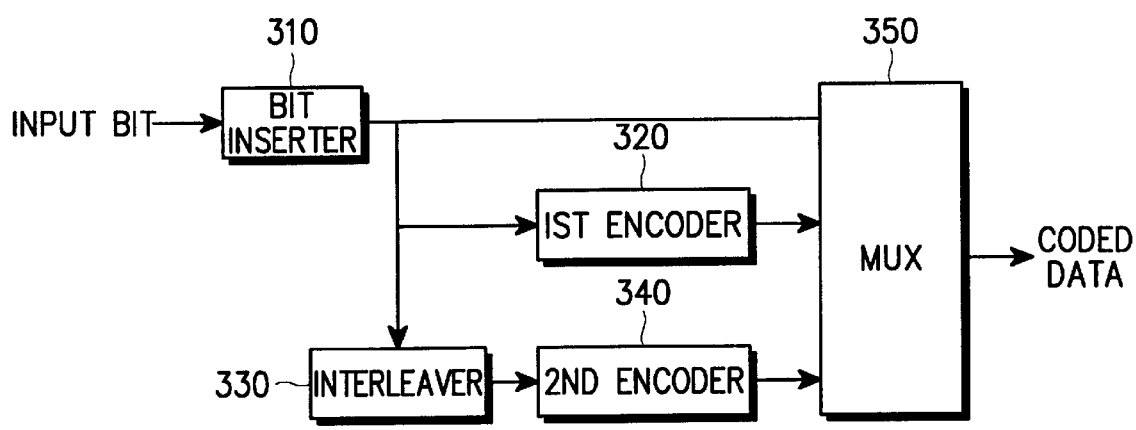
FIG. 3 is a diagram illustrating a channel encoder according to a first embodiment of the present invention.

FIG. 3 is a diagram illustrating a turbo encoder having a bit inserter for inserting the specific bits according to the first embodiment of the present invention. A bit inserter 310 includes a bit generator for generating specific bits by processing input data bits, and generates data bits in the frame unit by inserting the specific bits generated by the bit generator in the received data bit stream at predefined bit insert positions. In the embodiment, it is assumed that a position where the bit inserter 310 inserts a specific bit is the latter portion of the data bit stream. Insertion of the specific bits are determined by an undepicted controller. A first constituent encoder 320 encodes the data bits output from the bit inserter 310. An interleaver 330 interleaves the data bits in the frame unit, output from the bit inserter 310, according to a predetermined rule so as to re-arrange the sequence of the data bits. In the exemplary embodiment, a diagonal interleaver is used for the interleaver 330.

A second constituent encoder 340 encodes the interleaved data bits in the frame unit, output from the interleaver 330. Recursive systemic convolutional encoders can be used for the first and second constituent encoders 320 and 340. A multiplexer 350 multiplexes outputs of the bit inserter 310, the first constituent encoder 320 and the second constituent encoder 340, under the control of the undepicted controller. Here, the bit inserter 310 outputs the data bits $I_k$. The first constituent encoder 320 outputs the first parity bits $P1_k$, and the second constituent encoder 340 outputs the second parity bits $P2_k$.

Figure 4:
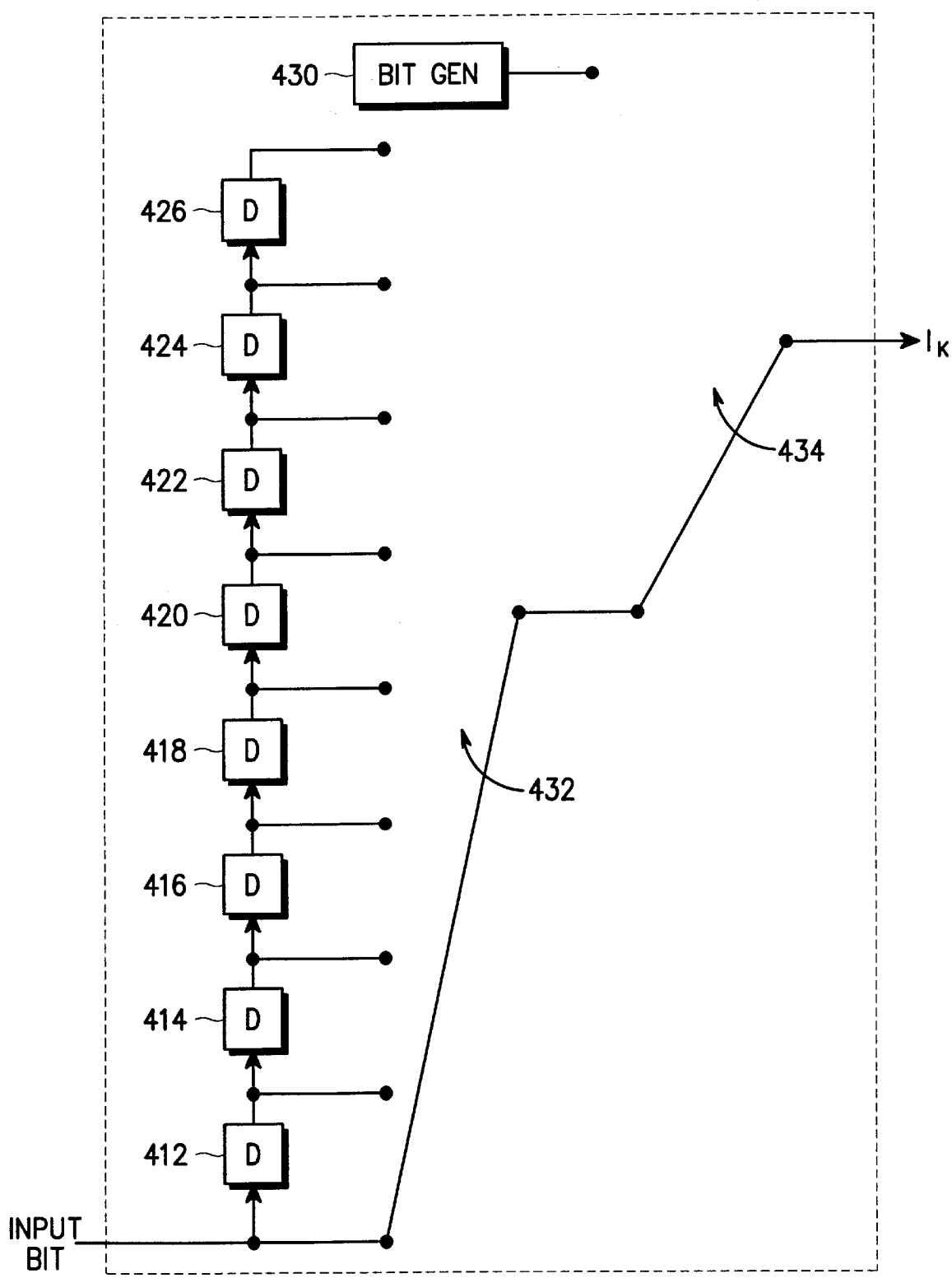
FIG. 4 is a detailed diagram illustrating a bit inserter of FIG. 3.

FIG. 4 is a detailed block diagram illustrating the bit inserter 310 in the turbo encoder of FIG. 3. Referring to FIG. 4, a bit generator 430 generates specific bits to be inserted amongst the data bits. Here, the specific bits are assumed to be zero bits. Delays 412–426, which may be embodied as memory elements such as flip-flops, may have a serial shift register structure for shifting an input data bit according to a bit clock.

A switch 432 is switched to select the outputs of the delays 412–426, under the control of the undepicted controller. Also, the switch 432 is switched to an output of a next delay at the positions where a specific bit output from the bit generator 430 is inserted in the data bits, under the control of the undepicted controller. That is, the switch 432 selects a data bit being delayed by one bit, when the selected specific bit is inserted in the data bits. The switch 432 can be implemented by a multiplexer. A switch 434 is switched to outputs of the bit generator 430 and the switch 432 to generate data bits $I_k$, under the control of the undepicted controller. The switch 434 selects either the specific bits or the data bits for insertion at the predefined positions, under the control of the controller.

Referring to FIG. 4, a description will be made directed to the operation of inserting the specific bits. The input data bits are delayed by the delays 412–426 according to the bit clock. Initially, the switch 432 selects the input data bits (i.e., Pole 1) and the switch 434 is initially connected to the switch 432 (i.e., Pole B). Then, the input data bits are output via the switches 432 and 434. In the meantime, when a bit insert position is determined, the switch 432 is connected to the output of the delay 412 (i.e., Pole 2) and the switch 434 is connected to the output of the bit generator 430 (i.e., Pole A), under the control of the controller. As a result, a path for the data bits is cut off and the zero bit output from the bit generator 430 is inserted in the corresponding bit position. In the case where the data bits are continuously output after insertion of the zero bit, the switch 434 is again connected to the switch 432 by the controller. That is, since the one bit-delayed data bit is selected after insertion of the zero bit, the zero bit can be inserted at the predefined position without loss of the data bit.

The zero bits are inserted in the data bits for one frame by repeating this process. Upon reception of data bits for the next frame after insertion of the zero bits, the switch 432 is again connected to an input bit node (Pole 1) and the above process is repeated again. In the case where data bits are encoded for communication, an error probability is statistically relatively higher at the rear portion of the data bit stream input to the respective constituent encoders. Accordingly, the positions where the zero bits output from the bit generator 430 are inserted, can be mostly located at the rear portion of the data bit stream as shown in Table 1, by way of example.

TABLE 1

| I1 I2 I3 I4 I5 I6 I7 I8 I9 I10 I11 Ib1 I12 I13 I14 Ib2 I15 I16 Ib3 Ib4 Ib5 Ib6 Ib7 Ib8 |
| --- | where Ix denotes data bits and Ibx inserted bits.

Figure 5:
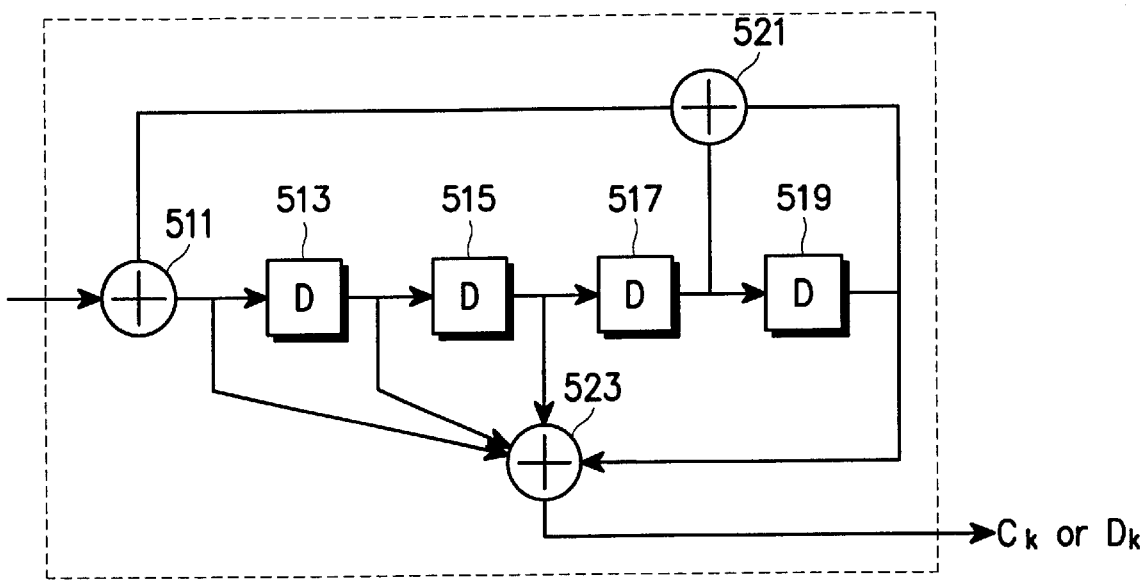
FIG. 5 is a detailed diagram illustrating a constituent encoder of FIG. 3.

The data bits of Table 1, output from the bit inserter 310, are applied to both the first constituent encoder 320 and the interleaver 330 in parallel. The interleaved data bits in the frame unit, output from the interleaver 330, are encoded by the second constituent encoder 340. FIG. 5 illustrates a structure of the first and second constituent encoders 320 and 340 of FIG. 3 in accordance with the first embodiment. As illustrated, the first and second constituent encoders 320 and 340 are recursive systemic convolutional encoders. In addition, the constituent encoders 320 and 340 are configured not to generate tail bits, as shown in FIG. 5.

The first constituent encoder 320 encodes the data bits of Table 1, output from the bit inserter 310. The encoded data bits output from the first constituent encoder 320 are shown in Table 2.

TABLE 2

| C1 C2 C3 C4 C5 C6 C7 C8 C9 C10 C11 Cb1 C12 C13 C14 Cb2 C15 C16 Cb3 Cb4 Cb5 Cb6 Cb7 Cb8 |
| --- | where Cx denotes symbols output from the first constituent encoder 320, and Cbx denotes symbols of the inserted bits, output from the first constituent encoder 320. Here, in the case where the first constituent encoder 320 has the 1/3 coding rate, each symbol C becomes three symbols. Note, however, that Table 1 does not show the redundant symbols.

In the meantime, the interleaver 330 interleaves the data bits output from the bit inserter 310 and the second constituent encoder 340 encodes the interleaved data bits output from the interleaver 330. The encoded data bits output from the second constituent encoder 340 are shown in Table 3.

TABLE 3

D1 D2 D3 D4 D5 D6 D7 D8 D9 D10 D11 Db1 D12 D13 D14 Db2 D15 D16 Db3 Db4 Db5 Db6 Db7 Db8 where Dx denotes symbols output from the second constituent encoder 340 and Dbx symbols of the inserted bits, output from the second constituent encoder 340. Here, in the case where the second constituent encoder 340 has the 1/3 coding rate, each symbol D becomes three symbols. Although the sequence of the data bits was actually rearranged by interleaving, the sequence remains unchanged in Table 3, for the convenience of explanation.

The multiplexer 350 then multiplexes the outputs of the bit inserter 310, the first constituent encoder 320 and the second constituent encoder 340, under the control of the undepicted controller. Shown in Table 4 are the specific bit inserted-data bits and outputs of the first and second constituent encoders 320 and 340. The multiplexer 350 can multiplex input symbols in the sequence of the data symbol, the first parity symbol and the second parity symbol either on a frame unit basis as shown in Table 4, or on a symbol unit basis.

bits $D_k$, it is also possible to serially output the outputs of the bit inserter 310, the first constituent encoder 320 and the second constituent encoder 340 in the order of bit generation.

As can be appreciated from the foregoing descriptions, in the recursive systemic turbo encoder according to the first embodiment, the respective constituent encoders do not generate tail bits for termination, but instead, insert some number of specific bits (i.e., zero bits) at bit positions having a determined higher error probability.

Second Embodiment

Like the first embodiment, a channel encoder according to a second embodiment of the present invention inserts specific bits at bit positions having a higher error occurrence probability. However, the second embodiment may be differentiated from the first embodiment in that the number of the inserted bits is set to exceed the frame size (or length). In this exemplary embodiment, each frame is assumed to include 16 input data bits $I^k$ and 12 inserted bits. This embodiment adds four additional inserted bits. Since the output data bits $I_k$, parity bits $C_k$ and $D_k$ should equal 24 bits and 28 bits are generated in total, the surplus parity bits $C_k$ and $D_k$ are punctured from the data bits $I_k$ at the bit-inserted positions.

Figure 7:
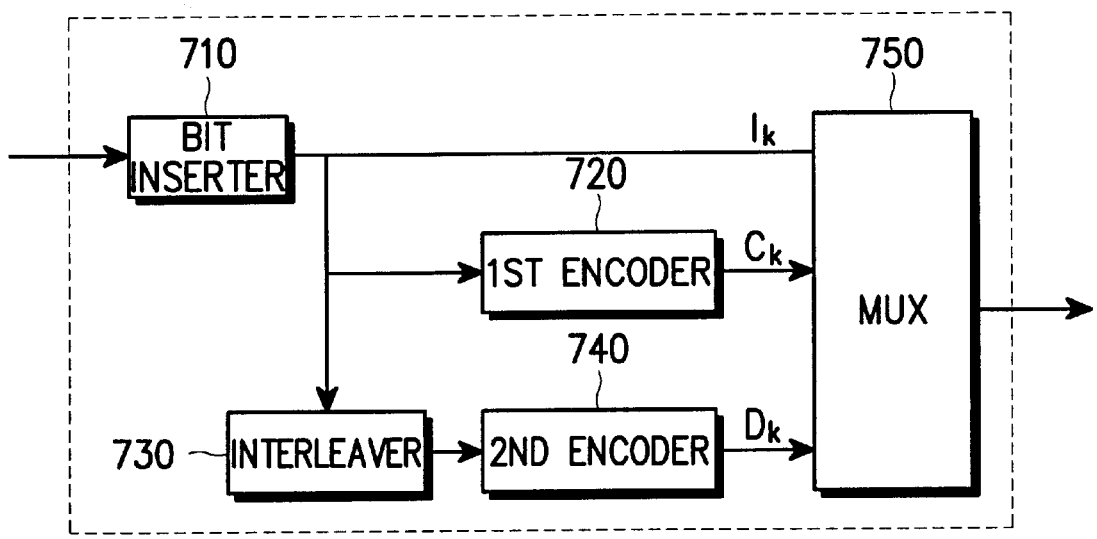
FIG. 7 is a diagram illustrating a channel encoder according to a second embodiment of the present invention.

FIG. 7 is a diagram illustrating the channel encoder according to the second embodiment of the present inven-

TABLE 4

I1 I2 I3 I4 I5 I6 I7 I8 I9 I10 I11 Ib1 I12 I13 I14 Ib2 I15 I16 Ib3 Ib4 Ib5 Ib6 Ib7 Ib8
C1 C2 C3 C4 C5 C6 C7 C8 C9 C10 C11 Cb1 C12 C13 C14 Cb2 C15 C16 Cb3 Cb4 Cb5 Cb6 Cb7 Cb8
D1 D2 D3 D4 D5 D6 D7 D8 D9 D10 D11 Db1 D12 D13 D14 Db2 D15 D16 Db3 Db4 Db5 Db6 Db7 Db8

Figure 6:
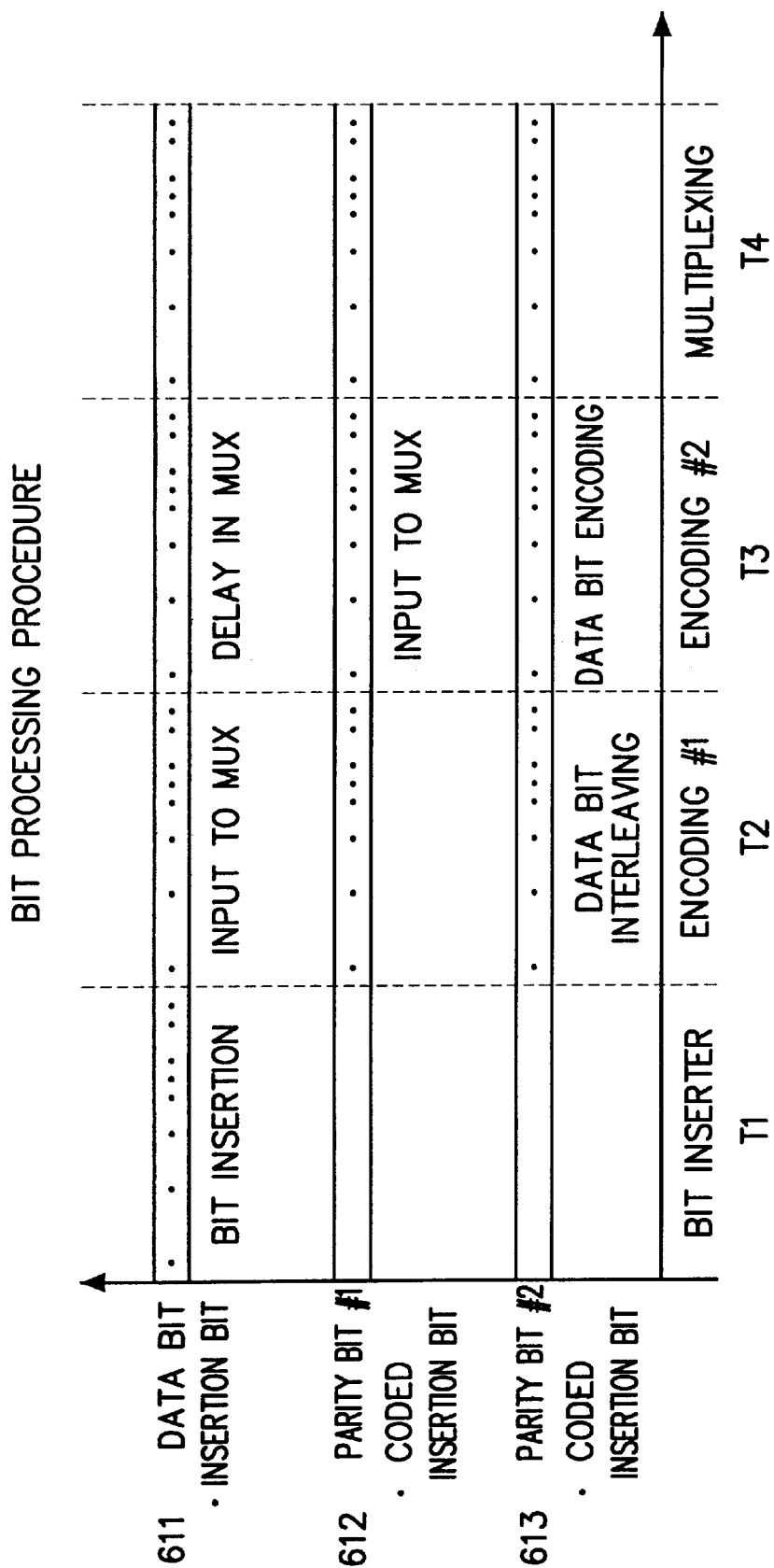
FIG. 6 is a diagram illustrating a bit processing procedure according to the first embodiment of the present invention.

FIG. 6 is a timing diagram of the turbo encoder of FIG. 3 according to the first embodiment of the present invention. Referring to FIG. 6, in an interval T1, the bit inserter 310 inserts the zero bits in the frame at the predefined bit positions to generate a bit inserted data bit stream $I_k$ where the inserted bits are zero valued of Table 1 (see 611). In an interval T2, the zero valued bit-inserted data bits $I_k$ are simultaneously applied to the multiplexer 350, the first constituent encoder 320 and the interleaver 330. Then, in the T2 interval, the first constituent encoder 320 encodes the zero valued bit-inserted data bits $I_k$ to generate first encoded data bits $C_k$ which are the first parity bits (see 612), and in the same T2 interval, the interleaver 330 interleaves the zero bit-inserted data bits $I_k$ according to the predefined rule (see 613).

Thereafter, in an interval T3, the multiplexer 350 delays the data bits $I_k$ output from the bit inserter 310 by one frame period, the first constituent encoder 320 inputs the first encoded data bits $C_k$ to the multiplexer 350 and the second constituent encoder 340 encodes the interleaved data bits $I_k$ output from the interleaver 330 to generate second encoded data bits $D_k$ which are the second parity bits. Upon completion of generating the second parity bits $D_k$ by the second constituent encoder 340, the multiplexer 350 multiplexes the data bits $I_k$, the first parity bits $C_k$ and the second parity bits $D_k$, in an interval T4.

Although FIG. 6 shows an example of parallel processing the data bits $I_k$, the first parity bits $C_k$ and the second parity tion. A bit inserter 710 includes a bit generator for generating specific bits by processing input data bits, and generates data bits exceeding the frame size by inserting the specific bits generated by the bit generator at predefined bit positions. A first constituent encoder 720 encodes the data bits output from the bit inserter 710 to generate first parity bits $C_k$. An interleaver 730 interleaves the data bits in the frame unit, output from the bit inserter 710, according to a predetermined rule so as to change the arrangement (or sequence) of the data bits. In the exemplary embodiment, a diagonal interleaver is used for the interleaver 730.

A second constituent encoder 740 encodes the interleaved data bits in the frame unit, output from the interleaver 730, to generate second parity bits $D_k$. A recursive systemic convolutional encoder can be used for the first and second constituent encoders 720 and 740. A multiplexer 750 multiplexes outputs of the bit inserter 710, the first constituent encoder 720 and the second constituent encoder 740 to generate a data frame of a predefined length, under the control of a undepicted controller. Here, the bit inserter 710 outputs the data bits $I_k$, the first constituent encoder 720 outputs the first parity bits $P1_k$ and the second constituent encoder 740 outputs the second parity bits $P2_k$.

In operation, upon receipt of the 16 input data bits $I_k$, the bit inserter 710 operates in the same manner as the bit inserter 310 of the first embodiment. The bit inserter 710 has a structure similar to that of FIG. 4 except that it is composed of 12 delays instead of 8. Therefore, the bit inserter 710 inserts 12 zero bits in the frame at 12 bit positions having the higher error probability by controlling the internal switches under the control of the undepicted controller. Accordingly, in this embodiment, the bit inserter 710 outputs the 28 data bits $I_k$ (i.e., 16 data bits and 12 zero bits), which are simultaneously applied to the multiplexer 750, the first constituent encoder 720 and the interleaver 730. Further, the interleaved data bits $I_k$ output from the interleaver 730 are applied to the second constituent encoder 740. Here, the first and second constituent encoders 720 and 740 have the structure of FIG. 5, which does not generate the tail bits for termination.

The first constituent encoder 720 then encodes the 28 data bits $I_k$ output from the bit inserter 710 with the 12 zero bits inserted therein, and outputs 28 first parity bits $C_k$ to the multiplexer 750. The interleaver 730 interleaves the 28 data bits $I_k$ output from the bit inserter 710, and the second constituent encoder 740 encodes the interleaved data bits in the same manner as the first constituent encoder 720 to generate 28 second parity bits $D_k$, which are applied to the multiplexer 750. The multiplexer 750 punctures the data bits $I_k$ to insert the four first parity bits $C_k$ and the four second parity bits $D_k$ in the punctured positions and then, outputs the remaining 24 first parity bits $C_k$ and the remaining 24 second parity bits $D_k$.

Figure 8:
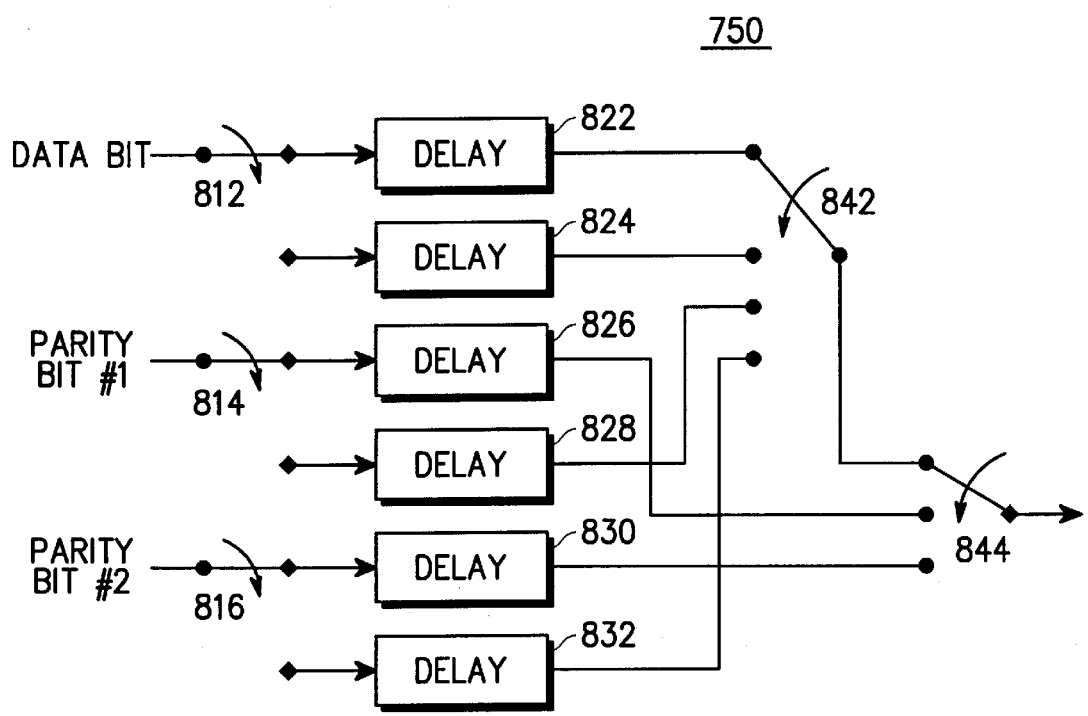
FIG. 8 is a detailed diagram illustrating a multiplexer of FIG. 7.

Referring to FIG. 8, the multiplexer 750 first receives the 28 data bits $I_k$ output from the bit inserter 710. Then, a switch 812 in the multiplexer 750 is connected to a delay 822 until the first 24 data bits out of the 28 data bits $I_k$ are received from the bit inserter 710. The delay 822 delays the first 24 received data bits $I_k$. Thereafter, the switch 812 is connected to a delay 824 until the remaining 4 data bits out of the 28 data bits $I_k$ are received from the bit inserter 710. The delay 824 delays the remaining 4 data bits.

In the same manner, the multiplexer 750 receives the 28 first parity bits $C_k$ output from the first constituent encoder 720. Then, a switch 814 in the multiplexer 750 is connected to a delay 826 until the first 24 data bits out of the 28 first parity bits $C_k$ are received from the first constituent encoder 720, and the delay 826 delays the received first parity bits $C_k$. Thereafter, the switch 814 is connected to a delay 828 until the remaining 4 first parity bits out of the 28 first parity bits $C_k$ are received from the first constituent encoder 720, and the delay 828 delays the received remaining 4 first parity bits.

Thereafter, the multiplexer 750 receives the 28 second parity bits $D_k$ output from the second constituent encoder 740. Then, a switch 816 in the multiplexer 750 is connected to a delay 830 until the first 24 data bits out of the 28 second parity bits $D_k$ are received from the second constituent encoder 740, and the delay 830 delays the received second parity bits $D_k$. Thereafter, the switch 816 is connected to a delay 832 until the remaining 4 second parity bits out of the 28 second parity bits $D_k$ are received from the second constituent encoder 740, and the delay 832 delays the received remaining 4 second parity bits.

As described above, the multiplexer 750 sequentially receives the 28 data bits $I_k$, the 28 first parity bits $C_k$ and the 28 second parity bits $D_k$, and separately stores the first 24 bits and the remaining 4 bits out of the respective bits in the corresponding delays. The switches 812–816 are controlled by the undepicted controller. Further, the delays 822–832 each are composed of cascaded memory elements and store the input bits until the corresponding delay process is completed.

Upon completion of the delay process, the switch 844 is connected to a switch 842 and the switch 842 is connected to the delay 822. Therefore, an output of the delay 822 is output via the switches 842 and 844. When one data bit stored in the delay 822 is output, the switch 842 is connected to the delay 824, maintaining connection with the switch 844. Then, one of the remaining data bits stored in the delay 824 is output via the switches 842 and 844. That is, the data bit stored in the delay 822 is punctured and the data bit stored in the delay 824 is output in its place. Thereafter, the switch 842 is connected to the delay 822, continuously maintaining connection with the switch 844. By repeating the above process 4 times, the data bits stored in the delay 822 are punctured and the four data bits stored in the delay 824 are inserted in the four punctured positions.

Subsequently, the switch 842 is connected to the delay 822, maintaining connection with the switch 844. Then, the output of the delay 822 is output via the switches 842 and 844. When one data bit stored in the delay 822 is output, the switch 842 is connected to the delay 828, maintaining connection with the switch 844. Then, one of the remaining four first parity bits stored in the delay 828 is output via the switches 842 and 844. Thereafter, the switch 842 is connected again to the delay 822, continuously maintaining connection with the switch 844. By repeating the above process 4 times, the data bits stored in the delay 822 are punctured and the four first parity bits stored in the delay 828 are inserted in the punctured positions.

In this manner, the data bits and the remaining four first parity bits are alternately output. Next, the switch 842 is connected to the delay 822, maintaining connection with the switch 844. Then, the output of the delay 822 is output via the switches 842 and 844. When one data bit stored in the delay 822 is output, the switch 842 is connected to the delay 832, maintaining connection with the switch 844. Then, one of the remaining four second parity bits stored in the delay 832 is output via the switches 842 and 844. Thereafter, the switch 842 is connected again to the delay 822, continuously maintaining connection with the switch 844. By repeating the above process 4 times, the data bits stored in the delay 822 are punctured and then, the remaining four second parity bits stored in the delay 832 are inserted in the punctured positions.

By way of the foregoing procedure, the 24 data bits stored in the delay 822 are punctured and then, the 4 data bits stored in the delay 824, the 4 first parity bits stored in the delay 828 and the 4 second parity bits stored in the delay 832 are inserted in the punctured positions. Accordingly, the multiplexer 750 punctures the data bits $I_k$ output from the bit inserter 710 and inserts the 8 parity bits in the punctured insert positions, thereby outputting 24 data bits.

Upon completion of the above process, the switch 844 is connected to the delay 826.

Then, the 24 first parity bits $C_k$ stored in the delay 826 are output. Thereafter, the switch 844 is connected to the delay 830 to output the 24 second parity bits $D_k$ stored in the delay 830.

Figure 9:
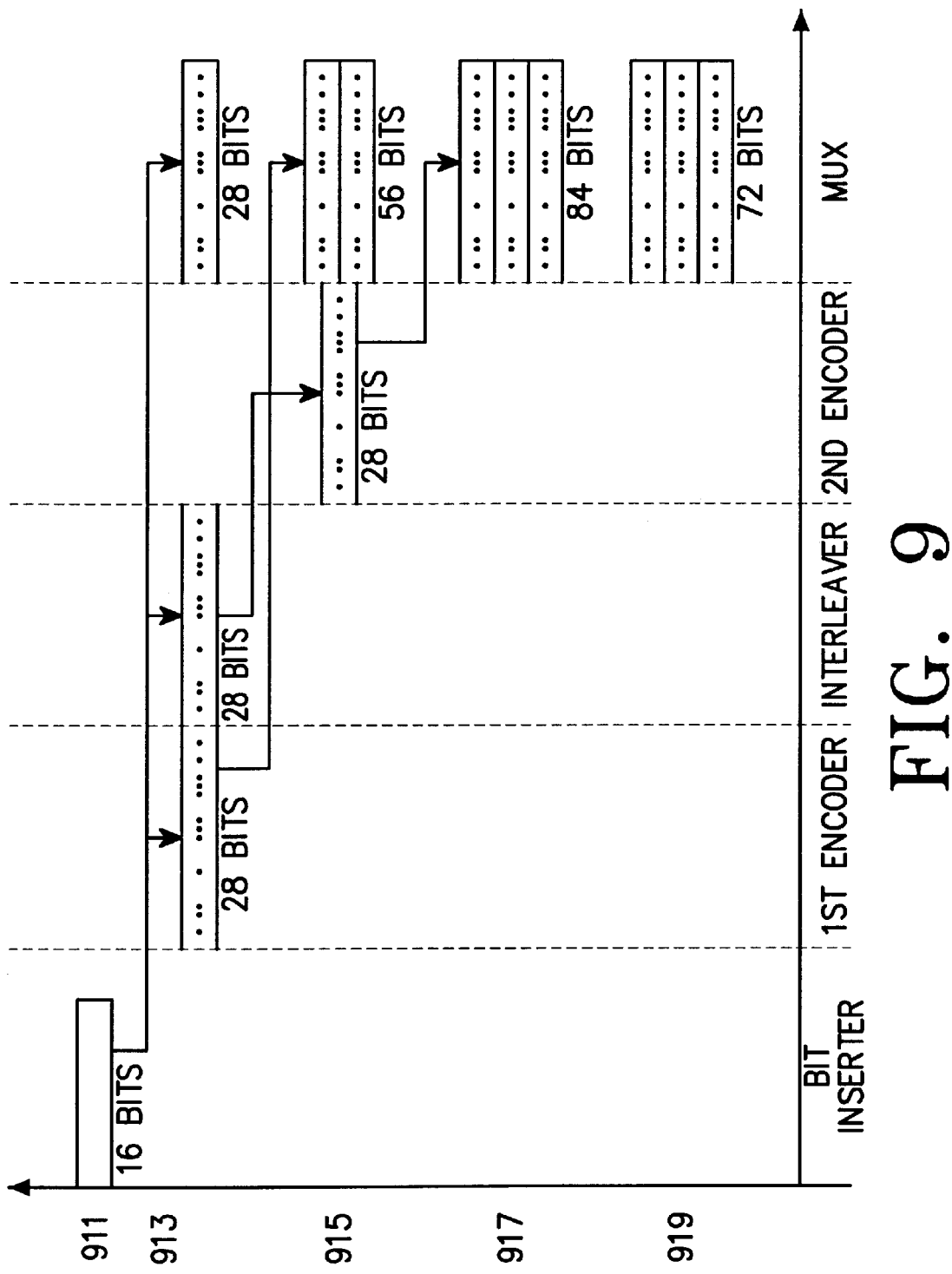
FIG. 9 is a diagram illustrating a bit processing procedure according to a second embodiment of the present invention.

Referring to FIG. 9, in the encoder of FIG. 7 according to the second embodiment, the bit inserter 710 inserts 12 bits in the 16 input data bits to generate the 28 data bits $I_k$. The first and second constituent encoders 720 and 740 generate the 28 first parity bits $C_k$ and the 28 second parity bits $D_k$, respectively. The multiplexer 750 punctures the 28 data bits $I_k$ at 12 insert positions and then, inserts therein the surplus data bits, i.e., 4 surplus data bits, 4 surplus first parity bits and surplus 4 second parity bits. Thereafter, the multiplexer 750 sequentially outputs the data bits $I_k$, the first parity bits $C_k$ and the second parity bits $D_k$.

In the decoding process, the output values of the multiplexer 750 are demultiplexed into a data bit portion, a first parity bit portion and a second parity bit portion, wherein the data bit portion is punctured with a value of −5 at the bit inserting portion. Such processed data bits are decoded by an existing decoder. (See Claude Berrou, Alain Glavieux and Punya Thitmajshima Near Shannon Limit Error-Correction Coding and Decoding: Turbo-Codes (1).)

Third Embodiment

An encoder according to a third embodiment of the present invention inserts data bits having a specific logic among the data bits at bit positions having a higher than normal error occurrence probability, wherein the constituent encoders encode the specific bit-inserted data bits and generate tail bits to be added to encoded data bits. That is, the encoder according to the third embodiment performs the termination function by both bit insertion and tail bit adding.

Figure 10:
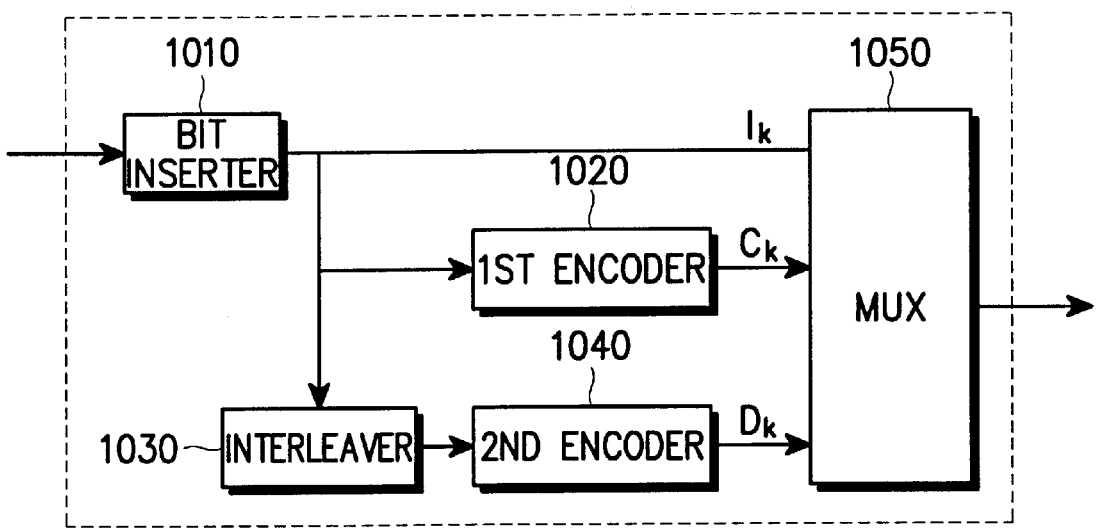
FIG. 10 is a diagram illustrating a channel encoder according to a third embodiment of the present invention.

FIG. 10 is a diagram illustrating the encoder according to the third embodiment of the present invention. Referring to FIG. 10, a bit inserter 1010 receives 16 input bits and has the same structure as the bit inserter 310 according to the first embodiment. The bit inserter 1010 inserts 8 zero bits in each frame at 8 data bit positions having a higher than normal error probability, under the control of a undepicted controller. Accordingly, in this exemplary embodiment, the bit inserter 1010 outputs 24 data bits $I_k$, which are applied in common to a multiplexer 1050, a first constituent encoder 1020 and an interleaver 1030.

Further, the interleaved data bits $I_k$ output from the interleaver 1030 are applied to a second constituent encoder 1040. The first constituent encoder 1020 is a recursive systemic constituent encoder shown in FIG. 11, having a structure for generating tail bits to be added to the encoded data bits. In addition, the first constituent encoder 1020 has a structure which does not generate the tail bits for termination, as that in FIG. 5 of the first embodiment.

Figure 11:
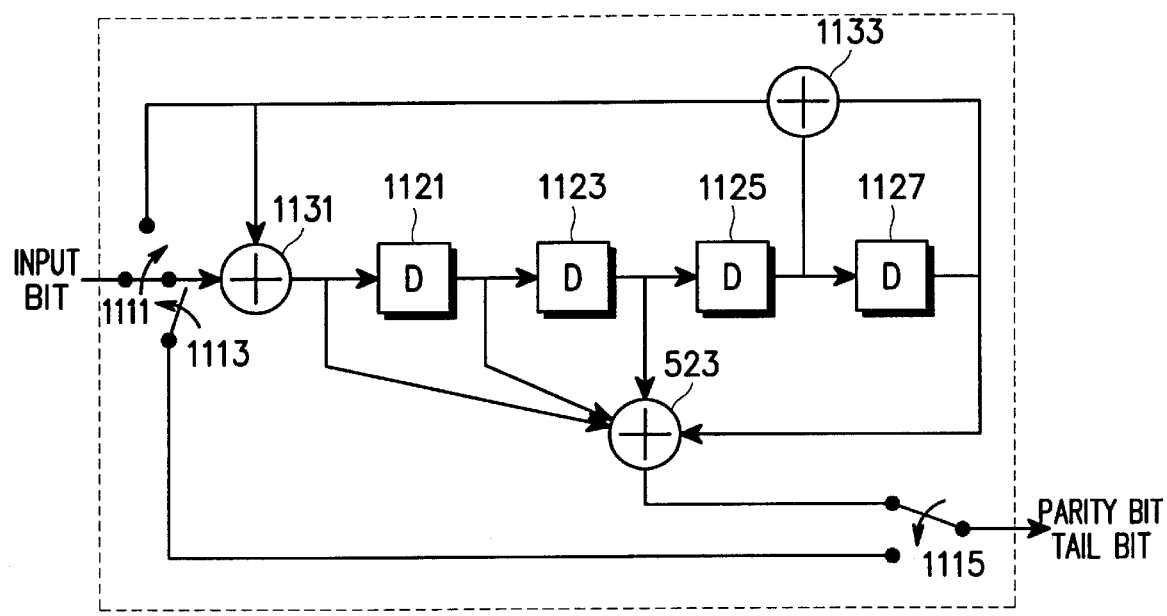
FIG. 11 is a detailed diagram illustrating a constituent encoder of FIG. 10.

Referring to FIG. 11, operation of the first constituent encoder 1020 will be described. For encoding, a switch 1111 connects an input node to an exclusive OR gate 1131, a switch 1113 maintains an OFF state, and a switch 1115 is connected to an exclusive OR gate 1135. Then, the 24 data bits $I_k$ are sequentially applied to delays 1121–1127 via the switch 1111, the exclusive OR gate 1131, and the exclusive OR gate 1135 outputs encoded data bits. When the data bits $I_k$ are all encoded by the delays 1121–1127 and the exclusive OR gate 1135 in this manner, the switch 1111 is connected to exclusive OR gates 1133 and 1131, the switch 1113 is ON, and the switch 1115 is connected to the switch 1113. Then, zero bits are generated by exclusive ORing the outputs being fed back, stored in the delays 1121–1127 and output via the switch 1115. Here, the zero values stored in the delays 1121–1127 become the tail bits and are output through the switch 1115. The number of tail bits generated corresponds to the number of delays in the constituent encoder 1020. In FIG. 11, the constituent encoder 1020 generates 4 tail bits per frame and also generates encoded bits for the respective tail bits.

Accordingly, the first constituent encoder 1020 generates 24 first parity bits $C_k$ and, upon processing the last data bit (i.e., the 24th data bit), switch 1111 connected to the exclusive OR gate 1133, the switch 1113 is connected to the switch 1111 and the switch 1115 is connected to the switch 1113; the same process is repeated four times to generate 4 tail bits. Through this procedure, the 28 first parity bits $C_k$ and the 4 tail bits are output to the multiplexer 1050.

In addition, the interleaver 1030 interleaves the 24 data bits $I_k$ output from the bit inserter 1010 and provides the interleaved data bits to the second constituent encoder 1040. The second constituent encoder 1040 then encodes the interleaved data bits in the same manner as the first constituent encoder 1020 to generate 24 second parity bits $D_k$, which are applied to the multiplexer 1050.

The interleaved data bits in the frame unit, output from the interleaver 1030, are encoded by the second constituent encoder 1040 which has the same structure as that shown in FIG. 5. The second constituent encoder 1040 is a recursive systemic convolutional encoder, as shown in FIG. 5. In addition, the second constituent encoder 1040 has a structure which does not generate the tail bits.

The multiplexer 1050 then punctures the data bits $I_k$, and inserts the 4 first parity bits $C_k$ in the punctured positions, and selectively outputs the remaining 24 first parity bits $C_k$ and the 24 second parity bits $D_k$.

Figure 12:
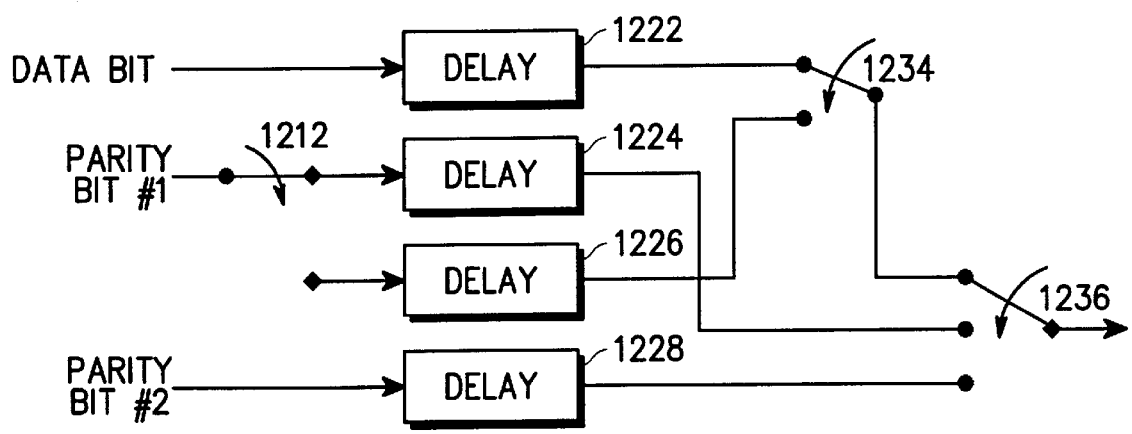
FIG. 12 is a detailed diagram illustrating a multiplexer of FIG. 10.

FIG. 12 is a diagram illustrating the multiplexer 1050. Referring to FIG. 12, the multiplexer 1050 first receives the 24 data bits $I_k$ output from the bit inserter 1010. A delay 1222 in the multiplexer 1050 then stores the received 24 data bits $I_k$.

Thereafter, the multiplexer 1050 receives the 28 first parity bits $C_k$ output from the first constituent encoder 1020. A switch 1212 in the multiplexer 1050 then is connected to a delay 1224 until the first 24 bits out of the first parity bits $C_k$ are received from the first constituent encoder 1020, and the delay 1224 stores the received first parity bits $C_k$. Subsequently, the switch 1212 is connected to a delay 1226 until the remaining 8 bits out of the 32 first parity bits $C_k$ are received from the first constituent encoder 1020, and the delay 1226 stores the remaining 8 bits of the first parity bits $C_k$.

Next, the multiplexer 1050 receives the 24 second parity bits $D_k$ output from the second constituent encoder 1040. A delay 1228 in the multiplexer 1050 then stores the received 24 second parity bits $D_k$.

Such sequentially generated 24 data bits $I_k$, 28 first parity bits $C_k$ and 24 second parity bits $D_k$ are applied to the multiplexer 1050. The multiplexer 1050 then stores the sequentially received data bits $I_k$, first parity bits $C_k$ and second parity bits $D_k$ in corresponding delays in the order of reception, wherein the first 24 bits and the remaining 4 bits out of the 28 first parity bits $C_k$ are separately stored in the corresponding delays. The delays 1222–1228 each are composed of cascaded memory elements and store the corresponding input bits until the above delay process is completed.

After the above delay process, a switch 1236 is connected to a switch 1234, and the switch 1234 is connected to delay 1222. Thus, an output of the delay 1222 is output via the switches 1234 and 1236. After a data bit at a pre-specified position is stored in the delay 1222 is output, the switch 1234 is connected to the delay 1226, maintaining connection with the switch 1236. Then, one of the surplus first parity bits stored in the delay 1226 is output via the switches 1234 and 1236. That is, the data bit stored in the delay 1222 is punctured and the first parity bit stored in the delay 1226 is inserted in the punctured position. Thereafter, the switch 1234 is connected again to the delay 1222, maintaining connection with the switch 1236. The above operation is repeated 8 times to puncture eight data bits stored in the delay 1222 and insert in the punctured positions the surplus 8 first parity bits stored in the delay 1226. As a result, the 24 data bits $I_k$ are punctured to insert the 8 first parity bits in the punctured positions (i.e., bit insert positions), thereby outputting 24 bits.

Thereafter, the switch 1236 is connected to an output of the delay 1224. Then, the 24 first parity bits $C_k$ stored in the delay 1224 are output via the switch 1236. Next, the switch 1236 is switched to the delay 1228 to output the 24 second parity bits $D_k$ stored in the delay 1228.

Figure 13:
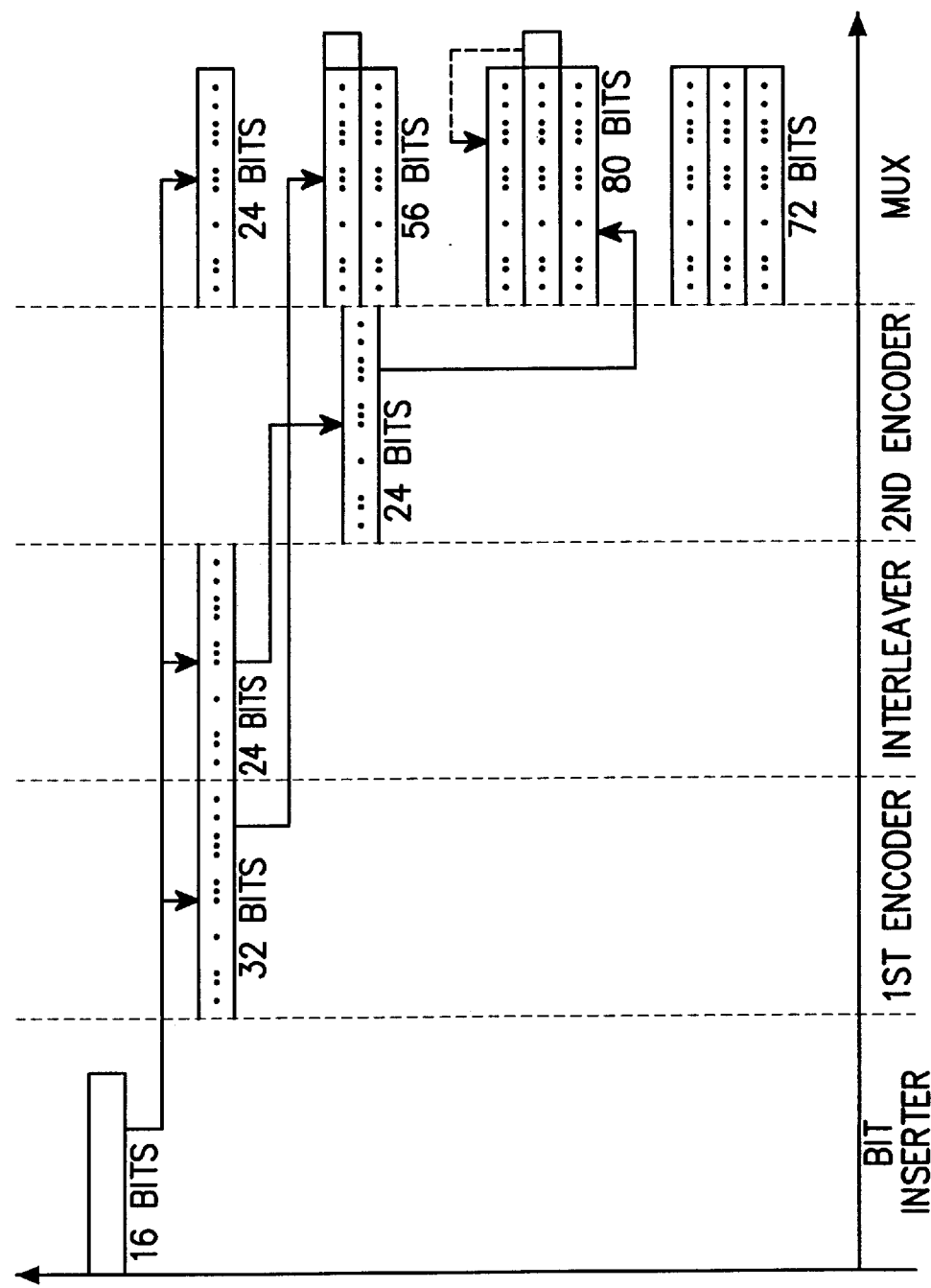
FIG. 13 is a diagram illustrating a bit processing procedure according to a third embodiment of the present invention.

Referring to FIG. 13, in the encoder of FIG. 10 according to the third embodiment, the bit inserter 1010 inserts 8 bits in the 16 input data bits to generate the 24 data bits $I_k$. A recursive systemic constituent encoder which generates the tail bits, is used for the constituent encoder. In this case, the constituent encoder generates 32 data bits in total, composed of 24 encoded data bits, 4 tail bits and encoded data of the 4 tail bits. When outputting the 24 encoded data bits, the input data bits $I_k$ are first punctured to insert the remaining 8 first parity bits (i.e., 4 tail bits and encoded data of 4 tail bits) in the bit punctured positions.

The channel coded specific bit-inserted symbols are transmitted through a channel, and a receiver then receives and decodes the channel coded symbols. In the decoding process, the output values of the multiplexer 1050 are demultiplexed into a data symbol portion, a first parity symbol portion and a second parity symbol portion, wherein the data symbol portion is punctured to insert therein a specific value of, for example, −5 at the bit inserting portion. Such processed data bits are decoded by an existing decoder. (See Claude Berrou, Alain Glavieux and Punya Thitmajshima Near Shannon Limit Error-Correction Coding and Decoding: Turbo-Codes (1).)

In the respective embodiments stated above, it is assumed that the encoder inserts the specific bits at the latter portion of the data bit stream. That is, the encoder inserts the specific bits at an end portion of a frame data to be transmitted. Since the data bits input to the second constituent encoder of the channel encoder are interleaved by the interleaver prior to being applied to the second constituent encoder, the last position of the data bit input to the first constituent encoder may not coincide with the last position of the data bit input to the second constituent encoder. In addition, since the insert positions of the specific bits being input to the second constituent encoder depend on the size and type of the interleaver, there is a demand for a method which can determine the last portion of the data bit stream to be input to the first and second constituent encoders in the channel encoder.

Figure 14:
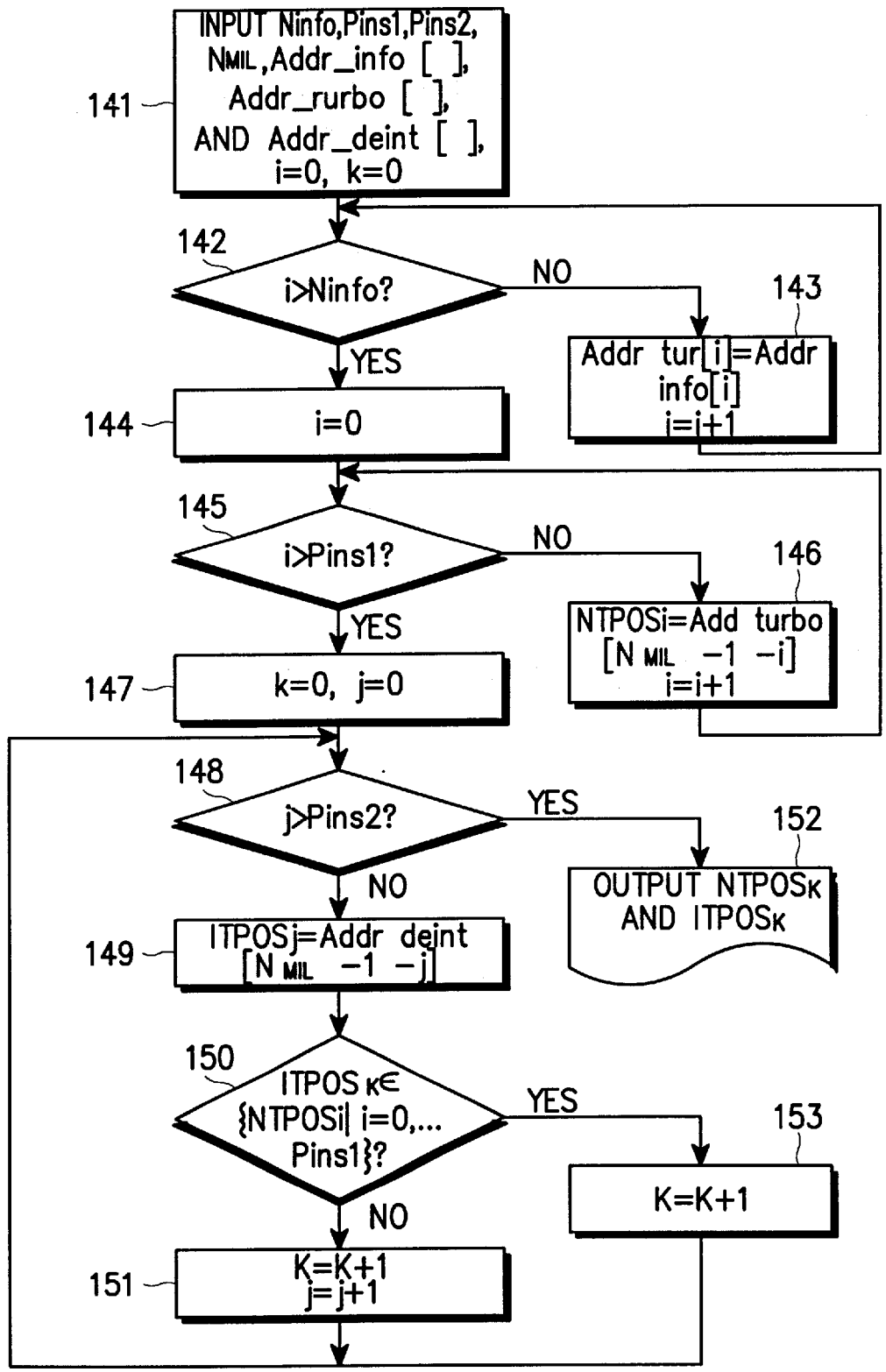
FIG. 14 is a diagram illustrating a procedure for inserting previously known bits in an input stage of a channel encoder according to an embodiment of the present invention.

The present invention provides a method for determining an insert position of a specific bit, which depends on the interleaver of the channel encoder. FIG. 14 illustrates a procedure for determining an insert position of the specific bit in the channel encoder. The flowchart of FIG. 14 describes a program to be performed by the channel encoder of FIG. 3. In the following description, a first constituent encoder corresponds to the first constituent encoder 320, a second constituent encoder corresponds to the second constituent encoder 340, and an interleaves corresponds to the interleaver 330. Further, the procedure defined by the flowchart of FIG. 14 controls the operation of the bit inserter 310 to insert the specific bits. When the bit inserter 310 has the structure of FIG. 4, the procedure of FIG. 14 can be performed by a undepicted controller which controls the operation of the switch 434 in the bit inserter 310. That is, the program of FIG. 14 controls the switch 434 to designate an insert position of a specific bit such that the specific bit output from the bit generator 430 should be located at the last portion of the data bit stream.

Referring to FIG. 14, in step 141, the following are provided as input: a data bit number Ninfo, an MIL interleaver's size $N_{MIL}$, the number of specific bits to be inserted at the last position of the data bit input to the first constituent encoder (Pins1), the number of specific bits to be inserted at the last position of the data bit input to the second constituent encoder (Pins2), arrays Addrinfo[], and Addrdeint[] for storing data bit positions of deinterleaved data bits and variables, array Addrturbo[] for storing positions of the data bits, and variables i and k initialized to "0". Thereafter, in step 142, it is determined whether the variable i is higher than the data bit number Ninfo. When i>Ninfo, the program proceeds to step 144; otherwise, the program goes to step 143. Step 143 is repeated as many times as the data bit number Ninfo. In step 143, the deinterleaved data bit positions Addrinfo[] are stored in the array Addrturbo[]. Step 143 is repeated as many times as the data bit number Ninfo to store all the data bit positions Addrinfo[] in the variables Addrturbo[] for storing positions of the data bits, and thereafter, the program proceeds to step 144 to initialize the variable i to "0".

After initialization of the variable i, it is determined in step 145 whether the variable i is higher than Pins1 the number of bits to be inserted at the last position of the data bit stream input to the first constituent encoder. Step 146 is repeated as many times as the number, Pinsl, of bits to be inserted at the last position of the data bit stream. When i≦Pins1, the program proceeds to step 146 where the last position of the data bit stream input to the first constituent encoder is designated as an insert position of a specific bit and is then stored in a variable NTPOSi. When the above operation is repeated as many times as Pins1, the number of specific bits to be inserted at the last position of the data bit stream being input to the first constituent encoder, the process continues to step 147 where the position of the specific bit to be inserted at the last position of Pins1=4 data bits being input to the first constituent encoder is stored and thereafter, the variables k and j are initialized to zero.

After initialization of the variables k and j, it is determined in step 148 whether the variable k is higher than Pins2, the number of the specific bits to be inserted at the last position of the data bit stream being input to the second constituent encoder. Steps 149, 150 and 151 are repeated as many times as the number, Pins2, of specific bits to be inserted at the last position of the data bit stream. When j≦Pins2, the process continues to step 149 where the positions of the bits located at the last portion of the data bit stream being input to the second constituent encoder are selected as insert positions of the specific bits and stored in a variable ITPOSj. Thereafter, in step 150, it is determined whether the position values stored in the variable ITPOSj overlap the position values stored in the variable NTPSOi. That is, the variable ITPOSj stores the positional information of the specific bits to be inserted at the last position of the data bits being input to the second constituent encoder, and the variable NTPOSi stores the positional information of the specific bits to be inserted at the last position of the data bits being input to the first constituent encoder. Therefore, when the information stored in ITPOSj overlaps the information stored in the NTPOSi, it means that the same specific bits are overlappedly inserted at the last portion of the data bits being input to the first and second constituent encoders.

Therefore, in step 150, it is judged whether the positions, stored in ITPOSj, of the bits to be inserted at the last position of the data bits being input to the second constituent encoder overlaps with the positions which were selected and stored in NTPOSi at step 146. When ITPOSj overlaps with NTPOSi, the variable k is increased by one in step 153. After increment of the variable k, the program returns to step 148. Therefore, when the positions of the specific bits to inserted at the last positions of the data bits being input to the first and second constituent encoders overlap each other, insert positions of other specific bits to be inserted at the last position of the data bits being input to the second encoder are stored in ITPOSj and then, the step 150 is performed again to determine whether the bit positions stored in ITPOSj overlap with the bit positions stored in NTPOSi. When the bit positions stored in ITPOSj do not overlap with the bit positions stored in NTPOSi, the variables k and j are increased by one in step 151, respectively. Thereafter, the program returns to step 148. The steps 148 to 153 are repeated as many times as Pins2. After repetition of the above steps as many times as Pins2 (i.e., when j>Pins2), the step 148 proceeds to step 152 where are output the variables ITPOSk and NTPOSk in which the insert positions of the specific bits are stored.

Therefore, in steps 148 and 152, when the bit positions stored in ITPOSj overlap with the insert positions of the specific bits stored in NTPOSi, the position of a specific bit to be inserted at the last portion of the data bit stream being input to the second constituent encoder is shifted to be designated to the other position. However, when they do not overlap each other, the designated position located at the last position of the data bit stream being input to the second constituent encoder is maintained, as it is. In the embodiment, when the bit positions stored in ITPOSj overlap with the insert positions of the specific bits, stored in NTPOSi, the specific bit insert position of the data bit stream being input to the second constituent encoder is changed. However, it is also possible to change the specific bit insert position of the data bit stream being input to the first constituent encoder.

For a better understanding of the program shown in FIG. 14, a detailed description will now be made as to how the program actually determines the insert position of the specific bit according to the interleaver.

First, if it is assumed that the input data bit stream has a length of 16 bits and the number of the specific bits to be inserted is 8, the size of the interleaver in use becomes (the length of data bit stream)+(the number of the specific bits to be inserted)=16+8=24 bits. Therefore, it will be assumed herein that the interleaver has a length of 24 bits, as shown in Table 5.

TABLE 5

0 6 12 18 1 7 13 19 2 8 14 20 3 9 15 21 4 10 16 22 5 11 17 23

Table 5 shows the positions of the bits arranged in the order they are output from the interleaver. That is, "0" appearing at the first bit position means that a 0-th input bit is first output; "6" appearing at the second bit position means that a sixth input bit is output next; and "12" appearing at the third bit position means that a twelfth input bit is output next.

With reference to FIG. 14, a description will be made regarding a method for determining the insert positions for the interleaver. In step 141, the length of the data bit stream is input as Ninfo=16, an MIL interleaver's size $N_{MIL}$=24, the number of specific bits to be inserted at the end of the data bit stream input to the first constituent encoder (Pins1=4), the number of specific bits to be inserted at the end of the data bit stream input to the second constituent encoder (Pins2=4), data bit positions Addrinfo[24], positions of deinterleaved data bits, and variables Addrdeinst[24], Addrturbo[24] for storing positions of the data bits, and variables i and k are initialized to "0".

Thereafter, in step 142, it is determined whether the variable i is higher than the data bit number Ninfo=16. When i>Ninfo(=16), the program proceeds to step 144; otherwise, the program goes to step 143. At this point, step 143 is repeated 16 times which correspond to the data bit number Ninfo=16, and the 16 data bit positions Addrinfo[16] are sequentially stored in the array Addrturbo[16]. Thereafter, the program proceeds to step 144 to initialize the variable i to "0".

After initialization of the variable i, it is determined in step 145 whether the variable i is higher than the number of bits to be inserted at the end of the data bit stream input to the first constituent encoder (Pins1=4). Step 146 is repeated as many times as the number (Pins1=4) of bits to be inserted at the end of the data bit stream. When i≦Pins1(=4), the program proceeds to step 146 where the last position of the data bit stream input to the first constituent encoder is designated as an insert position of a specific bit and is then stored in variables NTPOSi. That is, the positions of the last 4 bits prior to interleaving are stored in the variables NTPOSi. When the above operation is repeated as many times as the number, Pins1=4, of specific bits to be inserted at the last position of the data bit stream being input to the first constituent encoder, the process continues to step 147 where the position of the specific bit to be inserted at the last position of Pins1=4 data bits being input to the first constituent encoder is stored and thereafter, the variables k and j are initialized to zero. Shown in Table 6 are positions of the 4 bits inserted at the last position of the data bit frame prior to interleaving (i.e., 20, 21, 22 and 23).

TABLE 6

0 1 2 3 4 5 6 7 8 9 10 11 12 13 14 15 16 17 18 19 20 21 22 23

Next, it is determined in step 148 whether the variable k is higher than the number, Pins2=4, of specific bits to be inserted at the last position of the data bit stream being input to the second constituent encoder. Steps 149, 150 and 151 are repeated four times which correspond to the number of the specific bits to be inserted at the last position of the data bit stream (Pins2=4). When j≦Pins2(=4), the process continues to step 149 where the positions of the last 4 bits located at the last portion of the data bit stream being input to the second constituent encoder are selected as insert positions of the specific bits and stored in variables ITPOSj. Table 7 shows the insert positions of the last 4 bits, shown in Table 6, determined for the first constituent encoder prior to interleaving, together with the insert positions of the last 4 bits determined for the second constituent encoder after interleaving.

TABLE 7

0 1 2 3 4 5 6 7 8 9 10 11 12 13 14 15 16 17 18 19 20 21 22 23

Here, the insert positions of the last 4 bits prior to interleaving, determined for the first constituent encoder, are {20, 21, 22, 23}, and the insert positions of the last 4 bits after interleaving, determined for the second constituent encoder, are {5, 11, 17, 23}. It is noted that an insert position "23" out of the determined insert positions are only insert position "23" is overlapped. Therefore, the total number of the determined insert positions is not 8 but 7. Accordingly, in order to determine one more bit, it is determined in step 150 whether the positions, stored in the variable ITPOSj, of the bits to be inserted at the last position of the data bit stream being input to the second constituent encoder overlap the positions which are selected in step 146 and stored in the variable NTPSOi. Here, since the 23$^{rd}$ position is overlapped in Tables 6 and 7, the program proceeds to step 148 through step 151. Then, the process continues to step 149 where another insert position of a bit to be inserted at the last position of the data bit stream being input to the second constituent encoder is stored in ITPOSj to determine a $19^{th}$ bit position as an insert position. Thereafter, in step 150, it is determined again whether the bit positions stored in ITPOSj overlaps with the bit positions stored in NTPOSi. Here, since the $19^{th}$ bit position is not overlapped, this selected position is constantly stored. Thereafter, the steps 148, 149, 150, 151 and 153 are repeated as many times as Pins2. After repetition of the above steps, the variables ITPOSk and NTPOSk are output, which store the stored insert positions, in step 152. Table 8 shows the 8 insert positions output from the variables ITPOSk and NTPOSk.

TABLE 8

0 1 2 3 4 5 6 7 8 9 10 11 12 13 14 15 16 17 18 19 20 21 22 23

Here, the program of FIG. 14 can be expressed as:
```
<Step1>
Store input (information) bits
i=0
do while i<Ninfo
Addrturbo[i] =Addrinfo[i]
i=i+1
end do
<Step2>
i=0
do while i<Pins1
NTPOSi=Addrtrbo[NMIL-1-i]; insertion positions for end
    part of RSC1 input
insert zero bits to the Addrturbo[NTPOSi]; insert known
    (e.g., 0) bits to the
i=i+1
end do; predetermined positions
<Step3>
k=0
j=0
do while j <Pins2
ITPOSj=Addrdeint[NMIL-1-k]; insertion positions for end
    part of RSC2 input
if (OTPOSj=((NTPOSi) | | {ITPOS0, ITPOS1, . . . ,
    ITPOSk-1})) ;exclude overlapping
ITPOSj=ITPOSk+m; for the pre-processed positions
k=k+1
else ; m is certain integer value
insert zero bit to the Addrturbo[ITPOSk]
k=k+1
j=j+1
end do
Legend:
| |:or
```

As described above, the novel channel encoder including the recursive systemic constituent encoders can perform a channel coding function using a frame structure having the termination effect.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A turbo coding device comprising:
   a bit inserter for inserting at least one specific data bit at a last position of a data bit stream being input to a first constituent encoder, and inserting at least one specific data bit at a last position of an interleaved data bit stream being input to a second constituent encoder;
   the first constituent encoder for encoding the bit-inserted data bit stream to generate first parity symbols;
   an interleaver for interleaving the bit-inserted data bit stream;
   the second constituent encoder for encoding the interleaved data bit stream to generate second parity symbols; and
   a multiplexer for multiplexing outputs of the bit inserter, the first constituent encoder and the second constituent encoder.

2. The turbo coding device as claimed in claim 1, wherein the bit inserter inserts at least two specific data bits, wherein half of the specific data bits are inserted at the end of the data bit stream being input to the first constituent encoder and a remaining half of the specific data bits are inserted at the end of the data bit stream being input to the second constituent encoder.

3. The turbo coding device as claimed in claim 2, wherein the bit inserter shifts forward a position of a specific bit to be inserted in the second constituent encoder, when a position of a specific bit to be inserted in the first constituent encoder overlaps with a position of a specific bit to be inserted in the second constituent encoder.

4. A method for inserting a specific bit in a turbo coder having a first constituent encoder for encoding received data bits to generate first parity symbols, an interleaver for interleaving the specific bit-inserted data bits, and a second constituent encoder for encoding the interleaved data bits to generate second parity symbols, the method comprising the steps of:
   storing positions of the data bits having the same size as a size of a received frame;
   inserting a predetermined number of specific bits at a last position of data bits being input to the first constituent encoder; and
   determining a last position of data bits being input to the second constituent encoder after interleaving, and inserting the predetermined number of specific bits at the determined last position.

5. The method as claimed in claim 4, wherein the number of the specific bits inserted in the first constituent encoder is identical to the number of the specific bits inserted in the second constituent encoder.

6. The method as claimed in claim 4, wherein a position of a specific bit to be inserted in the second constituent encoder is shifted forward, when a position of a specific bit to be inserted in the first constituent encoder overlaps with a position of a specific bit to be inserted in the second constituent encoder.

* * * * *